(12) United States Patent
Dandl et al.

(10) Patent No.: US 6,729,850 B2
(45) Date of Patent: May 4, 2004

(54) APPLIED PLASMA DUCT SYSTEM

(75) Inventors: Raphael A. Dandl, San Marcos, CA (US); Bill H. Quon, Brea, AZ (US); Samuel S Antley, Mesa, AZ (US); Andrej S. Mitrovic, Phoenix, AZ (US); Wayne L. Johnson, Phoenix, AZ (US)

(73) Assignees: Tokyo Electron Limited, Tokyo (JP); James P. Gallagher, Scottsdale, AZ (US)

(*) Notice: Subject to any disclaimer, the term of this patent is extended or adjusted under 35 U.S.C. 154(b) by 0 days.

(21) Appl. No.: 10/283,358

(22) Filed: Oct. 30, 2002

(65) Prior Publication Data

US 2003/0117080 A1 Jun. 26, 2003

Related U.S. Application Data

(60) Provisional application No. 60/330,799, filed on Oct. 31, 2001.

(51) Int. Cl.[7] ................................................ H05H 1/00
(52) U.S. Cl. ...................... 417/48; 417/50; 315/111.71; 315/111.81
(58) Field of Search .................. 315/111.71, 111.81; 417/48, 50

(56) References Cited

U.S. PATENT DOCUMENTS

| | | | |
|---|---|---|---|
| 3,555,331 A | 1/1971 | Chuan |
| 3,746,474 A | 7/1973 | Lloyd |
| 3,994,625 A | 11/1976 | Welch |
| 4,397,611 A | 8/1983 | Wiesner et al. |
| 4,512,868 A | 4/1985 | Fujimura et al. |
| 4,641,060 A | 2/1987 | Dandl |
| 4,745,337 A | 5/1988 | Pichot et al. |
| 4,883,570 A | 11/1989 | Efthimion et al. |
| 4,902,934 A | 2/1990 | Miyamura et al. |
| 5,024,716 A | 6/1991 | Sato |
| 5,133,826 A | 7/1992 | Dandl |
| 5,165,861 A | 11/1992 | Jahns |
| 5,198,725 A | 3/1993 | Chen et al. |
| 5,203,960 A | 4/1993 | Dandl |
| 5,240,381 A | 8/1993 | Nagai et al. |
| 5,256,036 A | 10/1993 | Cole |
| 5,296,714 A | 3/1994 | Treglio |
| 5,370,765 A | 12/1994 | Dandl |
| 5,453,125 A | 9/1995 | Krogh |
| 5,475,354 A | 12/1995 | Valentian et al. |

(List continued on next page.)

FOREIGN PATENT DOCUMENTS

JP 54-73311 6/1979

OTHER PUBLICATIONS

McGraw–Hill Encyclopedia of Science & Technology, 7th ed., vol. 14, PLAS–QUI, pp. 9–11.

(List continued on next page.)

Primary Examiner—David Vu
(74) Attorney, Agent, or Firm—Pillsbury Winthrop LLP

(57) ABSTRACT

A plasma vacuum pump including an array of permanent magnets, one or more plasma conduits or ducts, components for accelerating plasma ions through these conduits, and supporting structures that together comprise at least one applied plasma duct system (APDS) cell. The APDS cell permits large volumes of particles and plasma to flow rapidly in a preferred direction while constricting the flow of neutral particles in the reverse direction. A plasma pump utilizing APDS technology is intended to permit a large throughput of ionized gas at the intermediate pressures of interest in the plasma-enhanced processing industry, compressing this gas to a pressure at which blower-type pumps can be used efficiently to exhaust the spent processing gas at atmospheric pressure.

30 Claims, 8 Drawing Sheets

U.S. PATENT DOCUMENTS

| | | | |
|---|---|---|---|
| 5,581,156 | A | 12/1996 | Roberts et al. |
| 5,754,008 | A | 5/1998 | Wartski et al. |
| 5,762,814 | A | 6/1998 | Ohara et al. |
| 5,824,607 | A | 10/1998 | Trow et al. |
| 5,855,686 | A | 1/1999 | Rust |
| 5,948,168 | A | 9/1999 | Shan et al. |
| 5,975,855 | A | 11/1999 | Ensberg et al. |
| 5,985,091 | A | 11/1999 | Suzuki |
| 6,229,264 | B1 | 5/2001 | Ni et al. |
| 6,422,825 | B2 | 7/2002 | Dandl et al. |

OTHER PUBLICATIONS

McGraw–Hill Encylopedia of Science & Technology, $7^{th}$ ed., vol. 7, FAB–GEN, pp. 597–599.

Dandl et al., "On the low–pressure mode transition in electron cyclotron heated plasmas," J. Vac. Sci. Technol. A 9(6), Nov./Dec. 1991, pp. 3119–3125.

Dushman et al., "Flow of gases through tubes and orifices," Scientific Foundations of Vacuum Technique, $2^{nd}$ ed., 1962, Chapter 2, pp. 80–117.

Quon et al., "Preferential electron–cyclotron heating of hot electrons and formation of overdense plasmas," Phys. Fluids B 1 (10), Oct. 1989, pp. 2010–2017.

Guest et al., "Whistler–wave electron cyclotron heating in uniform andnonuniform magnetic fields," Phys. Fluids B 2 (6), Jun. 1990, pp. 1210–1220.

Rose et al., "Motion of Individual Charges," in Plasmas and Controlled Fusion, Massachusetts Institute of Technology, 1961, Chapter 10, pp. 198–227.

APPLIED PLASMA DUCT SYSTEM

The application claims the benefit of U.S. provisional application 60/330,799 filed on Oct. 31, 2001.

CROSS REFERENCE TO RELATED APPLICATIONS

The present application is related to co-pending applications: U.S. Non-Provisional application Ser. No. 09/869,766, filed Jul. 2, 2001 now U.S. Pat. No. 6,559,601 entitled "PLASMA VACUUM PUMP"; U.S. Non-Provisional application Ser. No. 09/749,469, filed Dec. 28, 2000 now U.S. Pat. No. 6,422,825 entitled "PLASMA VACUUM PUMP CELL"; and U.S. Provisional Serial No. 60/196,920, filed Apr. 13, 2000 entitled "STAND ALONE PLASMA VACUUM PUMP". These co-pending applications are herein incorporated by reference in their entirety.

FIELD OF THE INVENTION

The present invention relates to plasma vacuum pumps, and in particular relates to plasma pumps that use an Applied Plasma Duct System (APDS).

BACKGROUND OF THE INVENTION

In many industrial processes employing plasmas, such as PECVD, etching, or other surface modifications of workpieces, for example, semiconductor devices such as VLSI chips, it is generally considered by those skilled in the art to be advantageous to generate the processing plasmas in suitable mixtures of gases maintained at pressures as low as 1–10 milliTorr. The purity and composition of the gas can best be controlled if the flow rate of fresh gas into the processing chamber is high relative to the processing rate. However, existing vacuum pumping technology can provide only limited throughput of gas in this pressure range. The pumping speed of widely used turbomolecular vacuum pumps, for example, generally decreases rapidly with increasing pressure at pressures above roughly 1 milliTorr. It would greatly facilitate the pumping of process gasses if a robust, cost-effective technology capable of high-speed pumping in the pressure range from 1–10 milliTorr were readily available.

For some time there has been a growing appreciation of the possible benefits of using the plasmas themselves as the active element in vacuum pumping technologies; for example, plasmas can pump a wide range of gasses, including hydrogen and helium, with equally high efficiencies; and plasma vacuum pumps can be highly tolerant of solid or corrosive process by-products.

These potential benefits have not yet been fully realized in practice for a number of technical reasons relating to efficient generation of plasma, the creation of a magnetic field suitable for both the plasma processing and the necessary channeling of the plasma flow, and simple and effective mechanisms for driving the plasma flow at pressures in the range of importance to plasma processing applications. In addition, the problem is exacerbated by the plasma's ability to shield its interior from low-frequency external electric fields, together with the complex atomic and molecular processes that become important in the pressure range of interest.

A plasma vacuum pump was described by Dandl in "Method and Apparatus Using Electron Cyclotron Heated Plasma for Vacuum Pumping", U.S. Pat. No. 4,641,060, issued on Feb. 3, 1987. This plasma vacuum pump provided high pumping speeds for all gases with no moving mechanical parts at gas pressures below 1 milliTorr.

SUMMARY OF THE INVENTION

The primary object of the present invention is to provide a plasma vacuum pump for plasma processing applications.

The above and other objects are achieved, according to the present invention, by a plasma processing system comprising: a plasma processing chamber; and plasma pump to pump particles from a first region in the plasma processing chamber containing a plasma to a second region containing a plasma at a higher pressure, wherein the plasma pump comprises a plurality of applied plasma duct system (APDS) cells, wherein each APDS cell comprises: a conduit having an inlet end, an outlet end, and a longitudinal axis extending from the inlet end to the outlet end, the conduit fluidly coupled to the first region and the second region; a magnetic field generator, constructed and arranged to generate a magnetic field having field lines generally parallel to the longitudinal axis; and an electric field generator, constructed and arranged to generate an electric field having field lines generally parallel to the longitudinal axis, such that charged particles within the conduit are accelerated longitudinally so as to pass through the conduit outlet.

DETAILED DESCRIPTION OF A PREFERRED EMBODIMENT

Figure 1A:
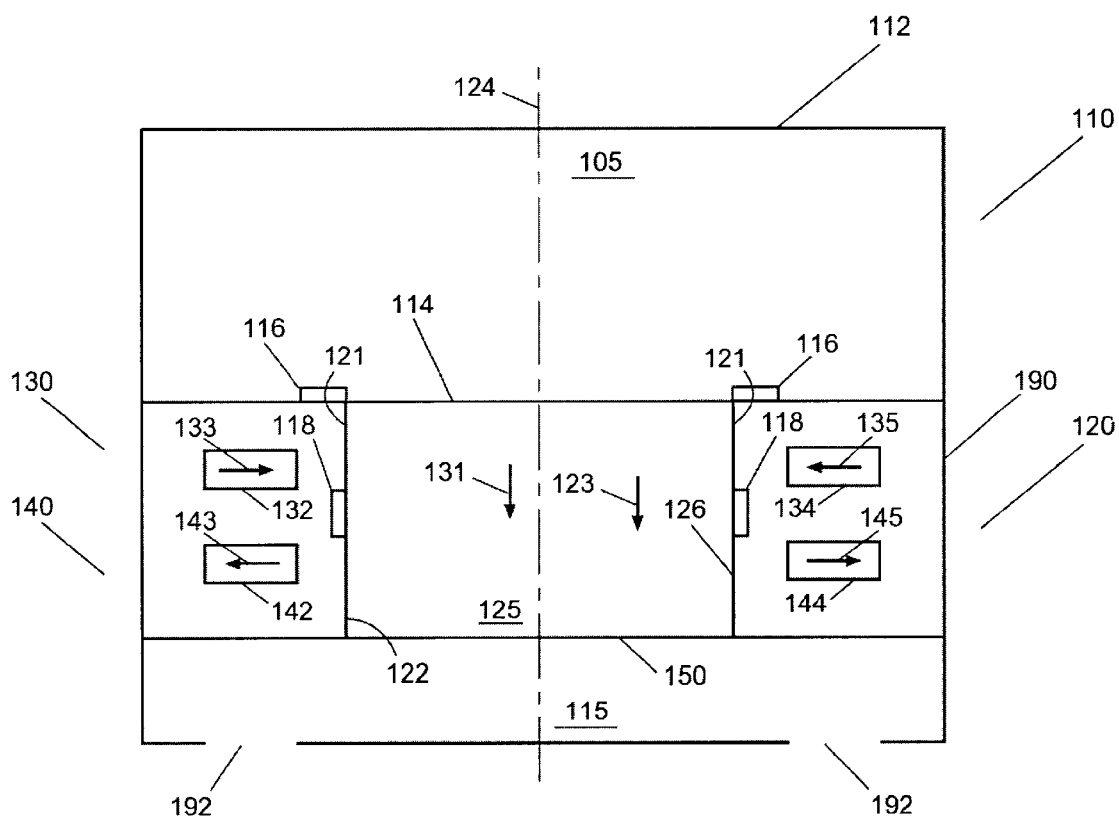
FIG. 1A is a schematic view showing a plasma processing system embodying the principles of the present invention.

FIG. 1A is a schematic view showing a plasma processing system embodying the principles of the present invention. Plasma processing system 100 comprises plasma processing device 110 and Applied Plasma Duct System (APDS) cell 120.

APDS cell, generally indicated at 120, is coupled to the plasma-processing device, generally indicated at 110. Plasma processing device 110 includes first region 105 that contains the plasma (not shown).

Plasma processing device 110 comprises chamber 112 that defines a first region of the plasma processing region, generally indicated at 105. Those skilled in the art will recognize that chamber 112 can contain a mounting device, which can be configured to attach a substrate thereon in order to deposit a layer of material on, or etch material from, the substrate surface.

A plasma generation gas or any other gas which is ionizable to produce a plasma, for example, argon gas, nitrogen gas, xenon gas, or the like, is introduced into plasma processing device 110, for example by a gas supply system (not shown), to be made into plasma. The gas supply system and gas are selected according to the desired application as understood by one skilled in the art. Plasma processing device 110 can comprise an inductively coupled plasma (ICP) source, a capacitively coupled plasma (CCP) source, or another type of source to produce plasma within first region 105. The plasma in first region 105 can also be referred to as source plasma.

APDS cell 120 comprises housing 190 that includes second region 115 that can contain a second plasma (not shown). The plasma in second region 115 can also be referred to as exit plasma. Second region 115 is at a higher pressure than first region 105 and contains a mixture of charged and neutral particles. APDS cell 120 is configured to pump charged and neutral particles from first region 105 to second region 115 so that the pumped particles pass through conduit 125. In the illustrated embodiment, pumped particles exit APDS cell 120 via openings 192 in housing 190.

APDS cell 120 includes magnetic field generator 130 and magnetic field generator 140 that are constructed and arranged to generate a magnetic field within conduit 125.

As shown in FIG. 1, magnet array 130 and magnet array 140 generate a magnetic field, indicated by exemplary lines of force illustrated by single-headed arrow 131, in conduit 125. Magnet array 130 comprises magnetic elements 132 and 134 that are disposed circumferentially around the periphery of conduit 125 at inlet end 121 thereof. Single-headed arrows 133 and 135, illustrated within magnetic elements 132 and 134, respectively, indicate the polarization direction of magnetic elements 132 and 134 that comprise magnet array 130 used to form the desired field 131.

Magnet array 140 comprises magnetic elements 142 and 144 that are disposed circumferentially around the conduit 125 proximate outlet end 122 thereof. Single-headed arrows 143 and 145 illustrated within magnetic elements 142 and 144, respectively, indicate the polarization direction of magnetic elements 142 and 144 that comprise magnet array 140 used to form the desired field 131.

In one embodiment, chamber outlet 114 has a circular shape and is coupled to chamber 112 to enable particles within plasma processing region 105 to exit chamber 112.

Conduit 125 comprises inlet end 121 disposed in fluid communication with chamber outlet 114 and outlet end 122 disposed in fluid communication with second region 115. Interior duct wall 126 of the conduit 125 extends between the inlet and outlet ends 121, 122 thereof and is substantially parallel to longitudinal axis 124.

Electrode 116 is positioned adjacent inlet end 121 of conduit 125, as shown in FIG. 1A. In the illustrated embodiment, electrode 116 is biased by an adjustable power supply (not shown) to a constant voltage, such as, for example, 0 volts, +10 volts or another appropriate bias voltage. In an alternate embodiment, electrode 116 can be biased by an adjustable power supply (not shown) using a time varying voltage.

Electrode 118 is positioned away from inlet end 121 of conduit 125, as shown in FIG. 1A. In the illustrated embodiment, electrode 118 is also biased by an adjustable power supply (not shown) to a constant voltage, such as, for example, 0 volts, −10 volts or another appropriate bias voltage. In an alternate embodiment, electrode 118 can be biased by an adjustable power supply (not shown) using a time varying voltage.

In one embodiment, electrode 116 is electrically positive relative to electrode 118. Electrodes 116 and 118 generate DC electric field 123 in the direction toward the outlet end of conduit 125. Electrodes 116 and 118 are used to provide a directed electric field having suitable strength therebetween and a directional component parallel to axis 124. In the illustrated embodiment, ions transfer energy to the neutral particles as well as being accelerated through conduit 125 by electric field 123. For example, electrode 118 can be located within the plasma conduit, just below the position of the upper separatrix in the magnetic field. Both electrodes are cylindrically symmetric and coaxial with the axis of symmetry of the APDS cell. In alternate embodiments, magnetic field 131 and electric field 123 can have time-varying components.

In the illustrated embodiment, conduit 125 is formed, for example of aluminum, in a generally cylindrical shape to have the inner duct wall 126, for example, made from a metal oxide such as alumina or silica (quartz) or another insulator or dielectric material. The inner wall 126 is provided along the interior periphery of the conduit 125 and extends generally parallel to the longitudinally extending axis 124.

In one embodiment, magnet arrays 130 and 140 are of mirror image construction. In addition, magnetic elements 132, 134, 142, and 144 in magnet arrays 130 and 140 are permanent magnets arrayed in an annular configuration. In an alternate embodiment, magnet arrays 130 and 140 can comprise electromagnets. For example, if the magnetic elements 132, 134, 142, and 144 were electromagnets, they could be properly shaped, placed and wound to produce an equivalent field of that if magnetic elements 132, 134, 142, and 144 were permanent magnets.

In the illustrated embodiment, gas ions are pumped out of the plasma-processing region 105 through chamber outlet 114 and into conduit 125 by magnet array 130.

Figure 1B:
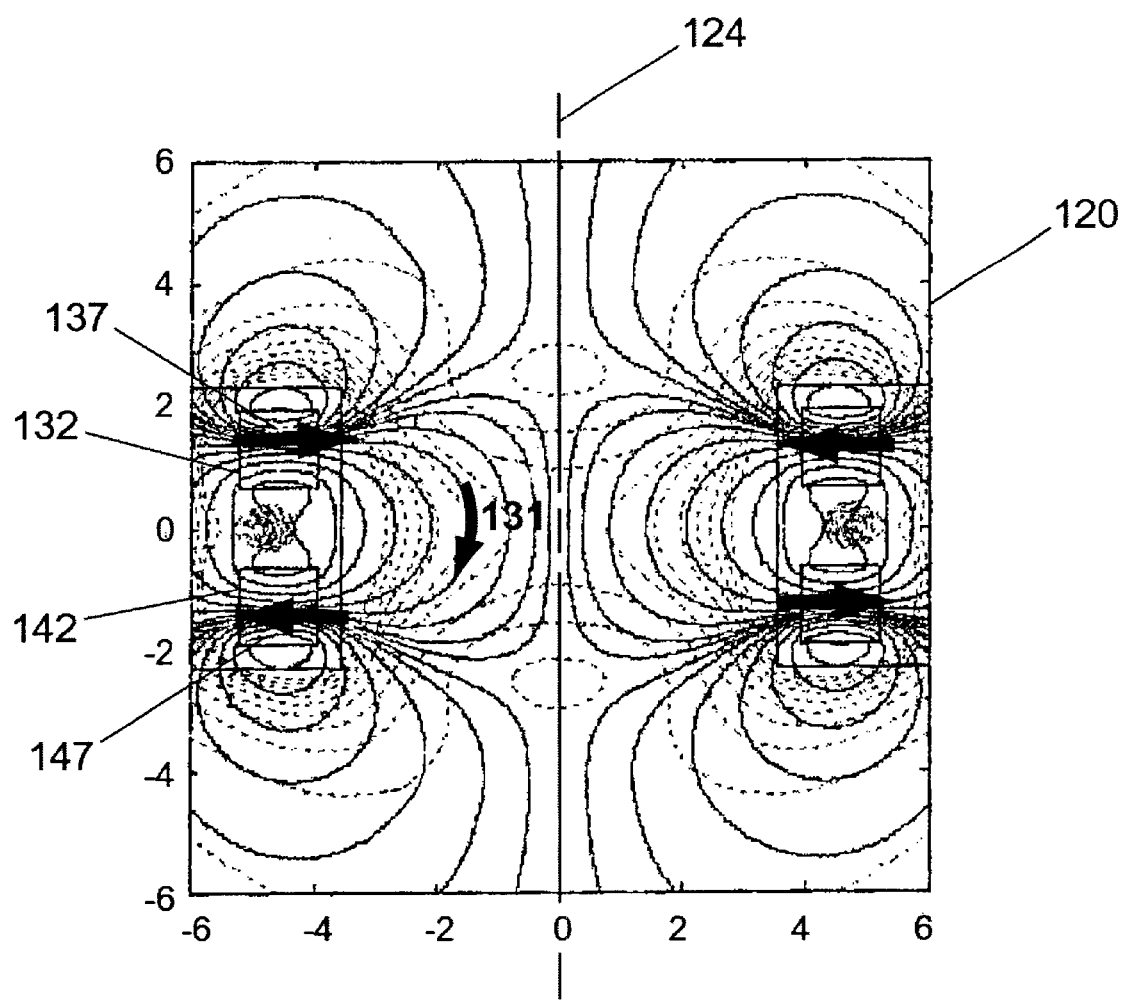
FIG. 1B illustrates an exemplary magnetic field in accordance with one embodiment of the present invention.

The detailed magnetic field of the one embodiment illustrated in FIG. 1A is plotted in FIG. 1B. There are two sets of separatrixes 137 and 147 starting from the permanent magnets 132 and 142. Above separatrix 137, the field lines connect the chamber outlet 114 to the conduit inlet 121, and guide the plasma from the first region 105 to the conduit 125. The magnetic field lines in the vicinity of the separatrixes 137 and 147 are predominantly transverse to axis 124. Between the two separatrixes, the magnetic field lines 131 are connecting to a magnetic field mirror of very high mirror ratio. Below the separatrix 147, there are divergent field lines connecting the conduit outlet to the second region 115.

For example, the magnetic field strength can be represented by the mod-B contour lines, the dashed curves in FIG. 1B. The magnetic field can be relatively strong, 800–1600 G near the conduit wall, comparing with the weaker field in the center region, <400 G. There are two minimum-B regions at the interception points between the separatrixes and the conduit axis.

The spatial configuration of the magnetic field is similar in some respects to that in the so-called spindle cusp magnetic configuration. Unlike the typical spindle cusp, however, the magnetic field of the present invention is produced by a generally cylindrically symmetrical ("axisymmetric") array of permanent magnets, as shown in FIGS. 1A and 1B.

In particular, the magnetic fields are axisymmetric; that is, the fields are independent of the azimuthal angle measured about a central axis, the axis of symmetry. The plasma conduits or ducts are coaxial with this axis of symmetry. In the center of the duct, there are regions of low magnetic field strength and adjacent regions near the inner walls of the duct where the field is relatively high. Electrons mainly follow the field lines to flow into the conduit. The more massive ions are not significantly affected by the magnetic field in the inner regions of the conduit, but are confined to the interior of the duct by the magnetic field near the duct wall where the field is high.

Under the influence of the axial electric field 123, which can be self-generated in the plasma or induced by voltages applied on the electrode 116 and 118, the positively charged plasma ions are accelerated from the first region 105 to the second region 115. The electrons, which have negative charge, tend to move in the opposite direction of the electric field. However, due to the presence of radial magnetic field, electrons are drifting in the E×B direction due to the Hall effect, which is the azimuthal direction about the axis 124. Thus electrons in this configuration will not be back-streaming to cause charge separation in the plasma. In contrast, the J×B Lorentz force in the direction of the axial electric field will accelerate the drifting electrons to move with the ions.

Electrons have a tendency to become trapped, i.e., contained in a helical orbit about the longitudinal axis 124 in mirror filed 135, within the magnetic region formed by magnet arrays 130 and 140. The trapped electrons generate a space charge that draws plasma from the plasma-processing region 105 through chamber outlet 114 to the inter-stage plasma region within conduit 125. The flow of ions through chamber outlet 114 tends to increase the pressure in the inter-stage plasma region below chamber 112, while decreasing the pressure in the plasma-processing region 105. Therefore, magnetic array 130 can act efficiently to pump particles out of chamber 112 into the conduit 125.

The inter-stage plasma region extends between the plasma-processing region 105 and plasma exit region 115 and can contain "inter-stage" plasma. The magnet arrays 130, 140 can shape or contain the "inter-stage" plasma.

In one embodiment, magnetic field 131 provides the mechanism necessary for reducing electron back flow (flow from the inter-stage plasma region to the plasma processing region 105), which can be minimized by, for example, using the Hall Effect in combination with the magnetic field.

Electric fields are generated using electrodes 116 and 118 in conduit 125 to accelerate charged particles from the plasma-processing region 105 in the longitudinal direction along axis 124 into the conduit 125. The electrons tend to follow the direction of the magnetic field 131 in the conduit 125, and the ions, which are generally heavier than the electrons, tend to follow the electric fields produced in the conduit 125. The J×B Lorentz force in the direction of the ions collectively accelerates the electrons that carry the current, as the ions tend to follow the electric fields, thus providing space-charge neutralization for the ions.

Some electrons in conduit 125 may neutralize some of the ions, which follow the electric fields in the conduit 125, to reduce a positive charge that would develop in the magnetic region between the magnet arrays. This positive charge could cause incoming ions to reflect away from the magnetic region.

In the illustrated embodiment, the electrode voltages are made progressively more negative in the direction of plasma flow from chamber 112 to the conduit 125 (downward as shown in FIG. 1A). For example, if the plasma processing region 105 has a potential of 20 V, and electrode 116 can be operated at 0 V. When electrode 118 is biased to an electric potential lower than the electric potential of electrode 116, positive particles can be pumped. Alternatively, electrode 118 can be biased to an electric potential higher than the electric potential of electrode 116 to pump negative particles.

In the illustrated embodiment, the electric field 123 accelerates ions in conduit 125 while ion-neutral charge exchange collisions rapidly transfer the ion momentum to the neutral particles. The magnetic field 131 causes electrons in the plasma to move circumferentially around the conduit 125, e.g., in a spiral trajectory about the longitudinal axis 124 of the conduit 125. The electric and magnetic fields 123 and 131, respectively, lead to an E×B drift, and radial components of the magnetic field deflect the electrons in a circumferential direction so that the electrons move in a spiral trajectory, accumulating energy as they gradually drift in the direction defined by the vector E×B (perpendicular to the electric field).

Although not shown in the illustrated embodiment, it is possible that the APDS cell 120 be coupled through openings 192 to an additional pump. For example, another plasma pump 120, a turbomolecular pump or other known pump, could be used to efficiently evacuate the expelled ions from region 115. The pump could serve as a supplemental pumping stage, or fore pump.

Coolant may be supplied to electrodes 116, 118 and magnet arrays 130, 140 through cooling supply passages (not shown) coupled to the APDS cell 120. Each cooling supply passage could be coupled to a cooling supply source. The cooling supply passages could be individually connected to a cooling supply source. Alternatively, cooling supply passages could be interconnected by a network of interconnecting passages, which connect all cooling supply passages in some pattern. Various leads, though not shown in the illustrated embodiment, may be coupled to the APDS cell 120, such as, for example, voltage probes or other sensors.

Alternate configurations of the APDS cell 120 are possible. For example, though conduit 125 is described above as being cylindrical, other shapes are possible. Additional pumping capacity may be obtained in the APDS cell 120 by providing additional magnet arrays.

In addition, outlet 150 can include a number of vertically spaced baffles extending therefrom at an angle. The angled configuration allows high-energy ions to pass therethrough while preventing low energy ions, for example, thermal ions, from passing therethrough in an opposite direction.

A cylindrical plasma conduit or duct can be formed in the APDS structure coaxial with the array of permanent magnets and shaped to permit electrically-charged particles to flow freely through the conduit while restricting the reverse flow of particles back into the chamber being pumped.

The flow of plasma electrons into the space just above the inlet of the plasma conduit can be guided by the magnetic field for local field strengths in excess of roughly 100 Gauss.

The plasma reaches the conduit wall only through a narrow region centered on the separatrix. The width of this leak region is shown by Bosch and Merlino to be inversely proportional to the magnetic field strength in the cusp. Thus, using high strength magnets, such as NdFeB, can reduce the leakage of plasma and heat out of the duct. In order to maintain very low magnetic field strengths on the axis of the duct while achieving high fields near the conduit walls it is necessary to employ high-gradient magnetic configurations. Note also that negative bias potentials applied to the ring electrodes can further reduce the rate at which plasma and heat leak out of the duct.

In general, the lower of the two ring electrodes is biased to a lower negative potential than the upper ring electrode to reduce electron leakage through the ring cusps and simultaneously to accelerate ions from the low-pressure inlet toward the high-pressure outlet of the duct. The strong magnetic field near the inner surface of the conduit prevents direct streaming of electrons between the two ring electrodes.

The individual APDS plasma-pumping cells employ multi-cusp magnetic fields and longitudinal electric fields for pumping particles from one chamber to another with the following general properties: (1) guides the flux of ions that normally flow to any surface to the pumping conduit using a strong magnetic field near the wall as the pumping medium; (2) magnetically confine the plasma in the pumping duct; (3) generates negligibly small magnetic or electric fields that extend into the plasma volume and affect the process plasma; (4) the pumping speed of individual cells can be varied by the power applied to the electrodes of that cell; (5) the cells have a geometry that allows them to be formed into arrays and thereby extended so as to cover a large fraction of the surface area of the plasma processing chamber; and (6) the cell design allows the surface that contains them to also inject process gas.

Figure 2:
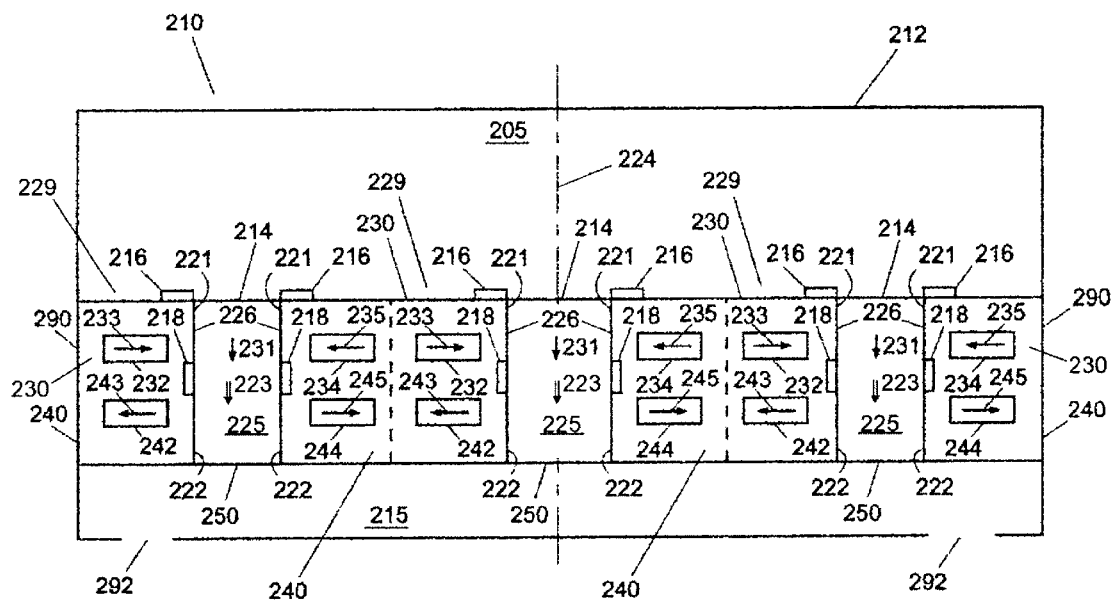
FIG. 2 is a schematic view showing a second plasma processing system embodying the principles of the present invention.

FIG. 2 is a schematic view showing a plasma processing system embodying the principles of the present invention. Plasma processing system 200 comprises plasma processing device 210 and plasma pump 220 that comprises a plurality of APDS cells 229.

The plurality of APDS cells, generally indicated at 229, are coupled to the plasma-processing device, generally indicated at 210. Plasma processing device 210 includes first region 205 that contains source plasma (not shown).

Plasma processing device 210 comprises chamber 212 that defines the first region of the plasma-processing region, generally indicated at 205. Those skilled in the art will recognize that chamber 212 can contain a mounting device, which can be configured to attach a substrate thereon in order to deposit a layer of material on, or etch material from, the substrate surface.

A plasma generation gas or any other gas which is ionizable to produce a plasma, for example, argon gas, nitrogen gas, xenon gas, or the like, can be introduced into plasma processing device 210, for example by a gas supply system (not shown), to be made into plasma. The gas supply system and gas are selected according to the desired application as understood by one skilled in the art. Plasma processing device 210 can comprise an inductively coupled plasma (ICP) source or a capacitively coupled plasma (CCP) source to produce plasma within first region 205. The plasma in first region 205 can also be referred to as source plasma.

Plasma pump 220 comprises housing 290 that includes second region 215 that can contain a second plasma (not shown). The plasma in second region 215 can also be referred to as exit plasma. Second region 215 can be at a higher pressure than first region 205 and may contain a mixture of charged and neutral particles. Plasma pump 220 is configured to pump charged and neutral particles from first region 205 to second region 215 so that the pumped particles pass through conduit 225. Pumped particles exit plasma pump 220 via openings 292 in housing 290.

In the illustrated embodiment, plasma pump 220 comprises three APDS cells 229. This is done for illustration purposes and does not limit the scope of the present invention.

Each of the plurality of APDS cells 229 includes magnetic field generator 230 and magnetic field generator 240 that are constructed and arranged to generate magnetic fields within conduits 225.

As shown in FIG. 2, magnet arrays 230, 240 generate magnetic fields, indicated by exemplary lines of force illustrated by single-headed arrows 231, in conduits 225. Magnet arrays 230 comprise magnetic elements 232 and 234 that are disposed circumferentially around the periphery of conduits 225 at inlet ends 221 thereof. Single-headed arrows 233 and 235, illustrated within magnetic elements 232 and 234, respectively, indicate the polarization directions of magnetic elements 232 and 234 that comprise magnet arrays 230 used to form the desired fields 231.

As shown in FIG. 2, magnet arrays 240 comprise magnetic elements 242 and 244 that are disposed circumferentially around the periphery of conduits 225 proximate outlet ends 222 thereof. Single-headed arrows 243 and 245 illustrated within magnetic elements 242 and 244, respectively, indicate the polarization directions of magnetic elements 242 and 244 that comprise magnet arrays 240 used to form the desired fields 231.

In the illustrated embodiment, chamber outlets 214 have a cylindrical shape and are formed in chamber 212 to enable particles within plasma processing region 205 to exit chamber 212. In an alternate embodiment, chamber outlets 214 can have a non-cylindrical shape.

Each of the plurality of APDS cells 229 includes conduit 225. Conduits 225 comprise inlet ends 221 disposed in fluid communication with chamber outlets 214 and outlet ends 222. Interior duct walls 226 of the conduits 225 extend between the inlet ends 221 and outlet ends 222 and are substantially parallel to longitudinal axis 224.

Electrodes 216 are positioned adjacent inlet ends 221 of conduits 225, as shown in FIG. 2. In the illustrated embodiment, electrodes 216 are biased by at least one adjustable power supply (not shown) to a constant voltage, such as, for example, 0 volts, +10 volts or another appropriate bias voltage. In an alternate embodiment, electrodes 216 can be biased by at least one adjustable power supply (not shown) using a time varying voltage.

Electrodes 218 are positioned away from inlet ends 221 of conduits 225, as shown in FIG. 2. In the illustrated embodiment, electrodes 218 are also biased by at least one adjustable power supply (not shown) to a constant voltage, such as, for example, 0 volts, −10 volts or another appropriate bias voltage. In an alternate embodiment, electrodes 218 can be biased by at least one adjustable power supply (not shown) using a time varying voltage.

In the illustrated embodiment, electrodes 216 are electrically positive relative to electrodes 218, which generate DC electric fields 223 in the direction toward the outlet ends of conduits 225. Electrodes 216 and 218 are used to provide directed electric fields having suitable strength therebetween and a directional component parallel to axis 224. In the illustrated embodiment, ions transfer energy to the neutral particles as well as being accelerated through conduit 225 by electric fields 223. In alternate embodiments, magnetic fields 231 and electric fields 223 can have time-varying components.

In the illustrated embodiment, conduits 225 are formed, for example of aluminum, in a generally cylindrical shape and have inner duct walls 226, for example, made from a metal oxide such as alumina or silica (quartz) or another insulator or dielectric material.

In the illustrated embodiment, magnet arrays 230 and 240 are of mirror image construction. In addition, magnetic elements 232, 234, 242, and 244 in magnet arrays 230 and 240 are permanent magnets arrayed in annular configurations. In an alternate embodiment, magnetic elements 232, 234, 242, and 244 in magnet arrays 230 and 240 can comprise electromagnets. For example, if the magnetic elements 232, 234, 242, and 244 were electromagnets, they could be properly shaped, placed and wound to produce an equivalent field of that if magnetic elements 232, 234, 242, and 244 were permanent magnets.

In the illustrated embodiment, ions are pumped out of the plasma-processing region 205 through chamber outlet 214 and into an inter-stage plasma region disposed within conduits 225 by way of pumps including magnet arrays 230.

Electrons have a tendency to become trapped, i.e., contained in a helical orbit about a longitudinal axis in the mirror field within the magnetic regions formed by magnet arrays 230 and 240. The trapped electrons generate space charges that draw plasma from the plasma-processing region 205 through chamber outlet 214 to the inter-stage plasma regions within conduits 225. The flow of ions through chamber outlet 214 tends to increase the pressure in the inter-stage plasma regions below chamber 212, while decreasing the pressure in the plasma-processing region 205. Therefore, magnetic arrays 230 can act efficiently to pump particles out of chamber 212 into the conduits 225.

The inter-stage plasma regions extend between the plasma-processing region 205 and plasma exit region 215 and contain "inter-stage" plasmas. The magnet arrays 230, 240 can shape or contain the "inter-stage" plasmas.

In addition, by using arrays of plasma pumping cells, the entire surface of the chamber can be covered, and by controlling the pumping power to each cell the pumping speed of selected local regions of the surface can be changed to affect, for example, the uniformity of the process. The electrodes (ion neutralizing surfaces) are separate circuits allowing for control of the spatially localized pumping speed.

Figure 3:
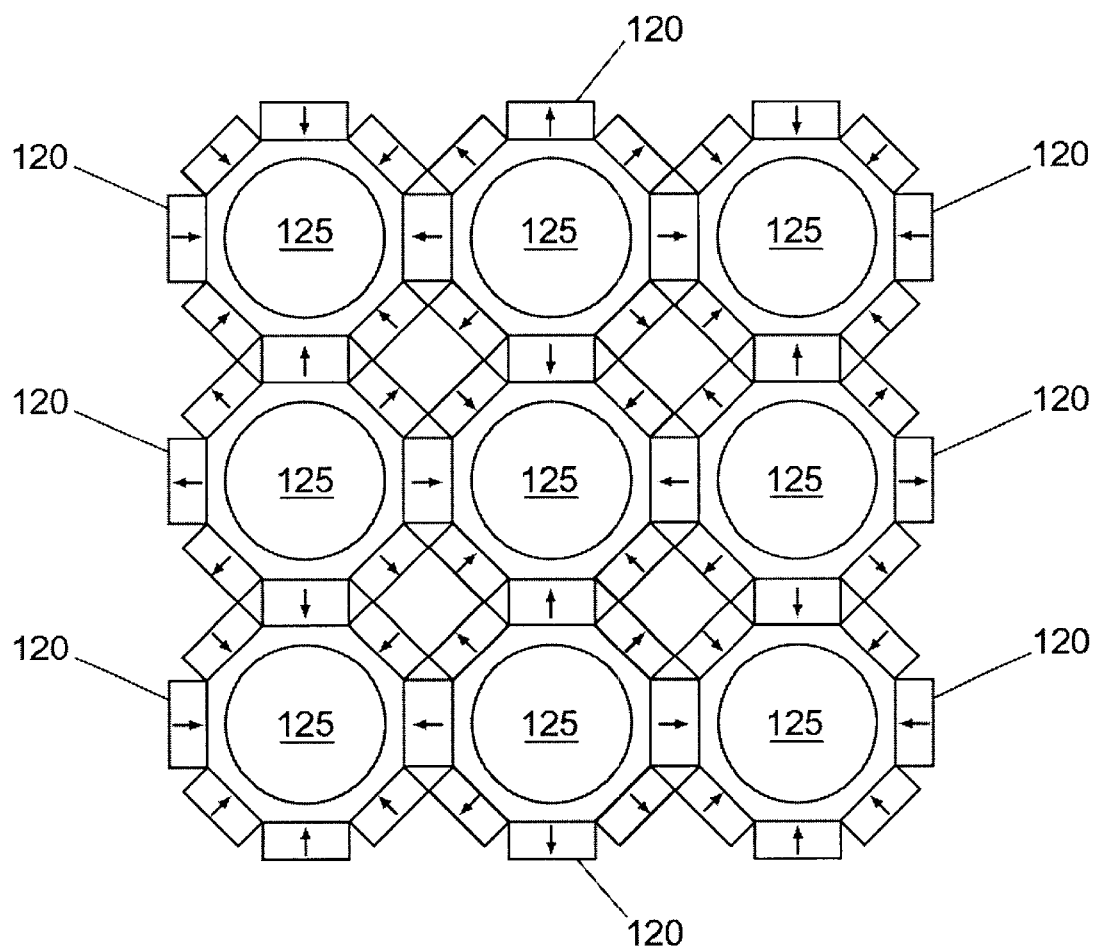
FIG. 3 is a schematic cross-sectional plan view showing the arrangement of permanent magnets in one stage of an array of nine APDS cells of the present invention.

FIG. 3 is a schematic cross-sectional plan view showing the arrangement of permanent magnets in one stage of an array of nine APDS cells 120. FIG. 3 shows a cross-sectional plan view of a nine-cell array of APDS cells, each of APDS cells is similar in structure to the single APDS cell shown in FIG. 1A. The cross-section shown in FIG. 3 is taken through the top layer of permanent magnets and shows how the magnets are shared in part by adjacent cells. The nine corresponding plasma conduits or ducts are indicated schematically in the figure.

Figure 4:
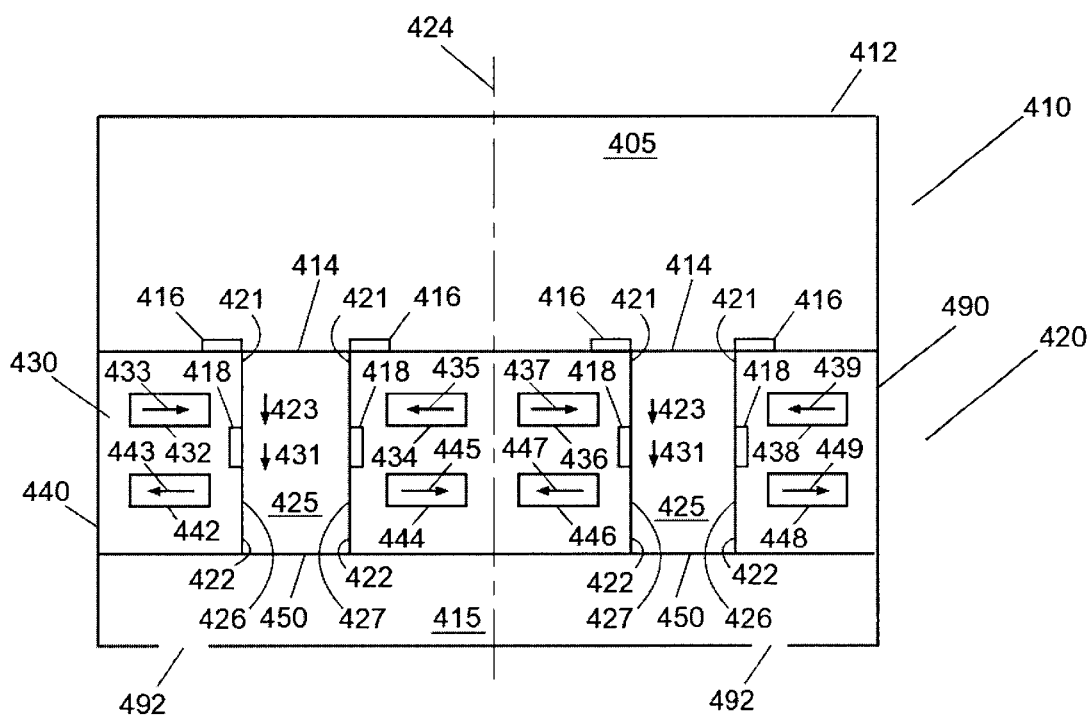
FIG. 4 is a schematic view showing a third plasma processing system embodying the principles of the present invention.

FIG. 4 is a schematic view showing another plasma processing system embodying the principles of the present invention. Plasma processing system 400 comprises plasma processing device 410 and APDS cell 420.

APDS cell, generally indicated at 420, is coupled to the plasma-processing device, generally indicated at 410. Plasma processing device 410 includes first region 405 that contains source plasma (not shown).

Plasma processing device 410 comprises chamber 412 that defines the first region of the plasma-processing region, generally indicated at 405. Those skilled in the art will recognize that chamber 412 can contain a mounting device, which can be configured to attach a substrate thereon in order to deposit a layer of material on, or etch material from, the substrate surface.

A plasma generation gas or any other gas which is ionizable to produce a plasma, for example, argon gas, nitrogen gas, xenon gas, or the like, is introduced into plasma processing device 410, for example by a gas supply system (not shown), to be made into plasma. The gas supply system and gas are selected according to the desired application as understood by one skilled in the art. Plasma processing device 410 can comprise an inductively coupled plasma (ICP) source or a capacitively coupled plasma (CCP) source to produce plasma within first region 405. The plasma in first region 405 can also be referred to as source plasma.

APDS cell 420 comprises housing 490 that includes second region 415 that can contain a second plasma (not shown). The plasma in second region 415 can also be referred to as exit plasma. Second region 415 can be at a higher pressure than first region 405 and may contain a mixture of charged and neutral particles. APDS cell 420 is configured to pump charged and neutral particles from first region 405 to second region 415 so that the pumped particles pass through outlet 450.

APDS cell 420 includes magnetic field generator 430 and magnetic field generator 440 that are constructed and arranged to generate a magnetic field B within conduit 425.

As shown in FIG. 4, magnet array 430 and magnet array 440 generate a magnetic field, indicated by exemplary lines of force illustrated by single-headed arrows 431 within conduit 425. Magnet array 430 comprises magnetic elements 432 and 438 that are disposed circumferentially around the outer periphery of conduit 425 at inlet end 421 thereof. Magnet array 430 further comprises magnetic elements 434 and 436 that are disposed circumferentially around the inner periphery of conduit 425 at inlet end 421 thereof. Single-headed arrows 433, 435, 437, and 439 illustrated within magnetic elements 432, 434, 436, and 438, respectively, indicate the polarization direction of magnetic elements 432, 434, 436, and 438 that comprise magnet array 430 used to form the desired field 431.

Magnet array 440 comprises magnetic elements 442 and 448 that are disposed circumferentially around the outer periphery of conduit 425 at inlet end 421 thereof. Magnet array 440 further comprises magnetic elements 444 and 446 that are disposed circumferentially around the inner periphery of conduit 425 at outlet end 422 thereof. Single-headed arrows 443, 445, 447, and 449 illustrated within magnetic elements 442, 444, 446, and 448, respectively, indicate the polarization direction of magnetic elements 442, 444, 446, and 448 that comprise magnet array 440 used to form the desired field 431.

In the illustrated embodiment, magnet arrays 430 and 440 are of mirror image construction. In addition, magnetic elements in magnet arrays 430 and 440 are permanent magnets arrayed in an annular configuration. In an alternate embodiment, magnetic elements in magnet arrays 430 and 440 can comprise electromagnets.

In the illustrated embodiment, magnet arrays 430 and 440 are positioned in vertically spaced relation with respect to one another.

Chamber outlet 414, which is illustrated as a ring in FIG. 4, is formed in chamber 412 to enable particles within the plasma-processing region 405 to exit chamber 412 and enter conduit 425 in APDS cell 420.

Conduit 425 comprises inlet end 421 disposed in fluid communication with chamber outlet 414 and distal end 422. Conduit 425 further comprises outlet 450 that is located at distal end 422. Outer wall 426, and inner wall 427 of the conduit 425 are generally parallel to longitudinal axis 424 and extend between the inlet and distal ends 421, 422 thereof.

Electrode 416 can be positioned adjacent inlet end 421 of conduit 425, as shown in FIG. 4. In the illustrated embodiment, electrode 416 is biased by an adjustable power supply (not shown) to a constant voltage, such as, for example, 0 volts, +10 volts (V) or another appropriate bias voltage. In an alternate embodiment, electrode 416 can be biased by an adjustable power supply (not shown) to a time varying voltage.

Electrode 418 can be positioned away from inlet end 421 of conduit 425, as shown in FIG. 4. In the illustrated embodiment, electrode 416 is also biased by an adjustable power supply (not shown) to a constant voltage, such as, for example, 0 volts, −10 volts (V) or another appropriate bias voltage. In an alternate embodiment, electrode 416 can be biased by an adjustable power supply (not shown) to a time varying voltage.

In this embodiment, electrode 416 is electrically positive relative to electrode 418, which generates a DC electric field 443 in the direction toward the distal end of conduit 425. Electrodes 416 and 418 are used to provide a directed electric field having suitable strength therebetween and substantially parallel to axis 424. In the illustrated embodiment, ions transfer energy to the neutral particles as well as being accelerated through conduit 425 by electric field 443. In alternate embodiments, the magnetic fields and electric fields can have time-varying components.

In the illustrated embodiment, conduit 425 can be formed, for example of aluminum, in a generally annular shape to have outer wall 426 and inner wall 427, for example, made from a metal oxide such as alumina or silica (quartz) or another insulator or dielectric material.

Figure 5:
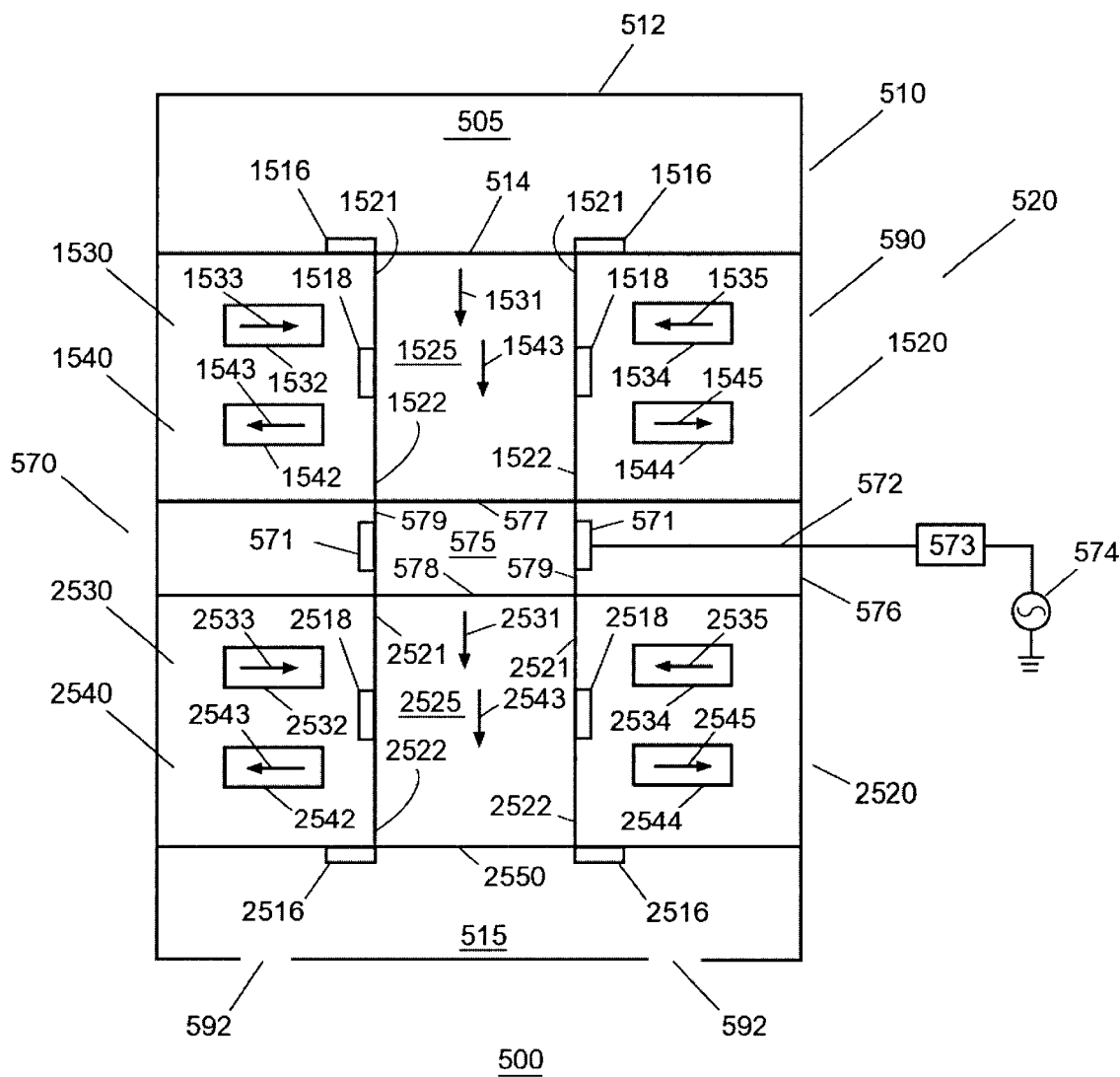
FIG. 5 is a schematic view showing a fourth plasma processing system embodying the principles of the present invention.

FIG. 5 is a schematic view showing another plasma processing system embodying the principles of the present invention. Plasma processing system 500 comprises plasma processing device 510 and plasma pump 520.

Plasma pump, generally indicated at 520, is coupled to the plasma-processing device, generally indicated at 510. Plasma processing device 510 includes first region 505 that contains source plasma (not shown).

Plasma processing device 510 comprises chamber 512 that defines the first region of the plasma-processing region, generally indicated at 505. Those skilled in the art will recognize that chamber 512 can contain a mounting device, which can be configured to attach a substrate thereon in order to deposit a layer of material on, or etch material from, the substrate surface.

A plasma generation gas or any other gas which is ionizable to produce a plasma, for example, argon gas, nitrogen gas, xenon gas, or the like, is introduced into plasma processing device 510, for example by a gas supply system (not shown), to be made into plasma. The gas supply system and gas are selected according to the desired application as understood by one skilled in the art. Plasma processing device 510 can comprise an inductively coupled plasma (ICP) source or a capacitively coupled plasma (CCP) source to produce plasma within first region 505. The plasma in first region 505 can also be referred to as source plasma.

Plasma pump 520 comprises housing 590 that includes second region 515 that can contain a second plasma (not shown). The plasma in second region 515 can also be referred to as exit plasma. Second region 515 can be at a higher pressure than first region 505 and may contain a mixture of charged and neutral particles. Plasma pump 520 is configured to pump charged and neutral particles from first region 505 to second region 515 so that the pumped particles pass through conduit 1525, duct 575, and conduit 2525.

Plasma pump 520 further comprises first APDS cell 1520, inter-stage plasma (ISP) source 570, and second APDS cell 2520.

First APDS cell 1520 includes magnetic field generator 1530 and magnetic field generator 1540 that are constructed and arranged to generate a magnetic field B within conduit 1525.

As shown in FIG. 5, magnet array 1530 generates a magnetic field, indicated by exemplary lines of force illustrated by single-headed arrows 1531, proximate inlet end 1521 of conduit 1525. Magnet array 1530 comprises magnetic elements 1532 and 1534 that are disposed circumferentially around the outer periphery of conduit 1525 at inlet end 1521 thereof. Single-headed arrows 1533 and 1535 illustrated within magnetic elements 1532 and 1534, respectively, indicate the polarization direction of magnetic elements 1532 and 1534 that comprise magnet array 1530 used to form the desired field 1531.

Second APDS cell 2520 includes magnetic field generator 2530 and magnetic field generator 2540 that are constructed and arranged to generate a magnetic field B within conduit 2525.

As shown in FIG. 5, magnet array 2530 generates a magnetic field, indicated by exemplary lines of force illustrated by single-headed arrows 2531, proximate inlet end 2521 of conduit 2525. Magnet array 2530 comprises magnetic elements 2532 and 2534 that are disposed circumferentially around the outer periphery of conduit 2525 at inlet end 2521 thereof. Single-headed arrows 2533 and 2535 illustrated within magnetic elements 2532 and 2534, respectively, indicate the polarization direction of magnetic elements 2532 and 2534 that comprise magnet array 2530 used to form the desired field 2531.

In the illustrated embodiment, magnet arrays 1530, 1540, 2530, and 2540 are of mirror image construction. In addition, magnetic elements in magnet arrays 1530, 1540, 2530, and 2540 are permanent magnets arrayed in an annular configuration around the conduits. In an alternate embodiment, magnetic elements in magnet arrays 1530, 1540, 2530, and 2540 can comprise electromagnets.

In the illustrated embodiment, ISP source 570 comprises loop antenna 571, transmission line 572, and duct 575. Duct 575 further comprises inlet 577, outlet 578, and wall 579. Loop antenna 571 can comprise one or more circumferentially extending elements to which RF power can be applied.

In FIG. 5, a single RF loop antenna 571 is shown extending circumferentially around duct 575. RF generator 574, matching network 573, and transmission line 572 are also shown in FIG. 5. RF power at suitable frequencies and power levels can be applied to electrode 571 through matching network 573, and transmission line 572. Also not shown in FIG. 5 are means such as Faraday shields well known to those skilled in the art of RF plasma sources. The purpose of ISP source 570 is to offset the loss of plasma and heat to the walls of the conduit by leakage through the ring cusps. Through suitable adjustment of the RF power to the loop antenna 571 the plasma density and temperature can be maintained uniform throughout the length of duct 575.

The "inter-stage" plasma can be a high-density local plasma, which can have a density on the order of five times that of the source plasma. The inter-stage plasma generator ionizes neutral particles to increase plasma density in the "inter-stage" plasma region, which in turn decreases the number of neutral particles in the inter-stage plasma region. Due to the increased ratio of plasma to neutral particles, the "inter-stage" plasma can contribute to enhanced pumping speed and pump compression ratio by ionizing and re-ionizing particles in the inter-stage plasma region.

Chamber outlet 514 can be a circular opening formed in chamber 512 to enable particles within the plasma processing region 505 to exit chamber 512 and enter conduit 1525 in plasma pump 520.

Conduit 1525 comprises inlet end 1521 disposed in fluid communication with chamber outlet 514 and distal end 1522. Conduit 1525 further comprises outlet 1550, which is located at distal end 1522. Outer wall 1526 of the conduit 1525 extends between inlet end 1521 and distal end 1522, and outer wall 1526 is substantially parallel to longitudinal axis 524.

In the illustrated embodiment, inlet 577 of ISP source 570 is coupled to outlet 1550 of first APDS cell 1520. Outlet 578 of ISP source 570 is coupled to inlet 2514 of second APDS cell 2520. Conduit 1525, duct 575, and conduit 2525 are coupled together to form a pump channel for pump 520.

Electrode 1516 is positioned adjacent inlet end 1521 of conduit 1525, as shown in FIG. 5. In the illustrated embodiment, electrode 1516 can be biased by an adjustable power supply (not shown) to a constant voltage, such as, for example, 0 volts, +10 volts (V) or another appropriate bias voltage. In an alternate embodiment, electrode 1516 can be biased by an adjustable power supply (not shown) to a time varying voltage.

Electrode 1518 can be positioned away from inlet end 1521 of conduit 1525, as shown in FIG. 5. In the illustrated embodiment, electrode 1518 can also be biased by an adjustable power supply (not shown) to a constant voltage, such as, for example, 0 volts, −10 volts (V) or another appropriate bias voltage. In an alternate embodiment, electrode 1518 can be biased by an adjustable power supply (not shown) to a time varying voltage.

In the illustrated embodiment, electrode 1516 is electrically positive relative to electrode 1518, which generates a DC electric field 1543 in the direction toward the distal end of conduit 1525. Electrodes 1516 and 1518 are used to provide a directed electric field having suitable strength therebetween and a directional component parallel to axis 524. In the illustrated embodiment, ions transfer energy to the neutral particles as well as being accelerated through conduit 1525 by electric field 1543. In alternate embodiments, magnetic field 1531 and electric field 1543 can have time-varying components.

In the illustrated embodiment, conduit 1525 is formed, for example of aluminum, in a generally annular shape to have outer wall 1526 and inner wall 1527, for example, made from a metal oxide such as alumina or silica (quartz) or another insulator or dielectric material.

Conduit 2525 comprises inlet end 2521 disposed in fluid communication with chamber 525. Conduit 2525 further comprises outlet 2550, which is located at distal end 2522. Outer wall 2526 of the conduit 2525 extends between inlet end 2521 and distal end 2522, and outer wall 2526 is substantially parallel to longitudinal axis 524.

Electrode 2516 can be positioned adjacent oulet end 2522 of conduit 2525, as shown in FIG. 5. In the illustrated embodiment, electrode 2516 can be biased by an adjustable power supply (not shown) to a constant voltage, such as, for example, 0 volts, −10 volts (V) or another appropriate bias voltage. In an alternate embodiment, electrode 2516 can be biased by an adjustable power supply (not shown) to a time varying voltage.

Electrode 2518 can be positioned away from inlet end 2521 of conduit 2525, as shown in FIG. 5. In the illustrated embodiment, electrode 2518 can also be biased by an adjustable power supply (not shown) to a constant voltage, such as, for example, 0 volts, +10 volts (V) or another appropriate bias voltage. In an alternate embodiment, electrode 2518 can be biased by an adjustable power supply (not shown) to a time varying voltage.

In the illustrated embodiment, electrode 2518 is electrically positive relative to electrode 2516, which generates a DC electric field 2543 in the direction toward the distal end of conduit 2525. Electrodes 2516 and 2518 are used to provide a directed electric field having suitable strength therebetween and parallel to axis 524. In the illustrated embodiment, ions transfer energy to the neutral particles as well as being accelerated through conduit 2525 by electric field 2543. In alternate embodiments, magnetic field 2531 and electric field 2543 can have time-varying components.

In the illustrated embodiment, conduit 2525 can be formed, for example of aluminum, in a generally annular shape to have outer wall 2526 and inner wall 2527, for example, made from a metal oxide such as alumina or silica (quartz) or another insulator or dielectric material.

Multiple stages can be used to reduce the back-streaming of neutral particles while further accelerating plasma ions. Two or more plasma pumping cells can be joined together using ISPs to reduce the conductance for particles flowing from the exit to the entrance of the duct.

Figure 6:
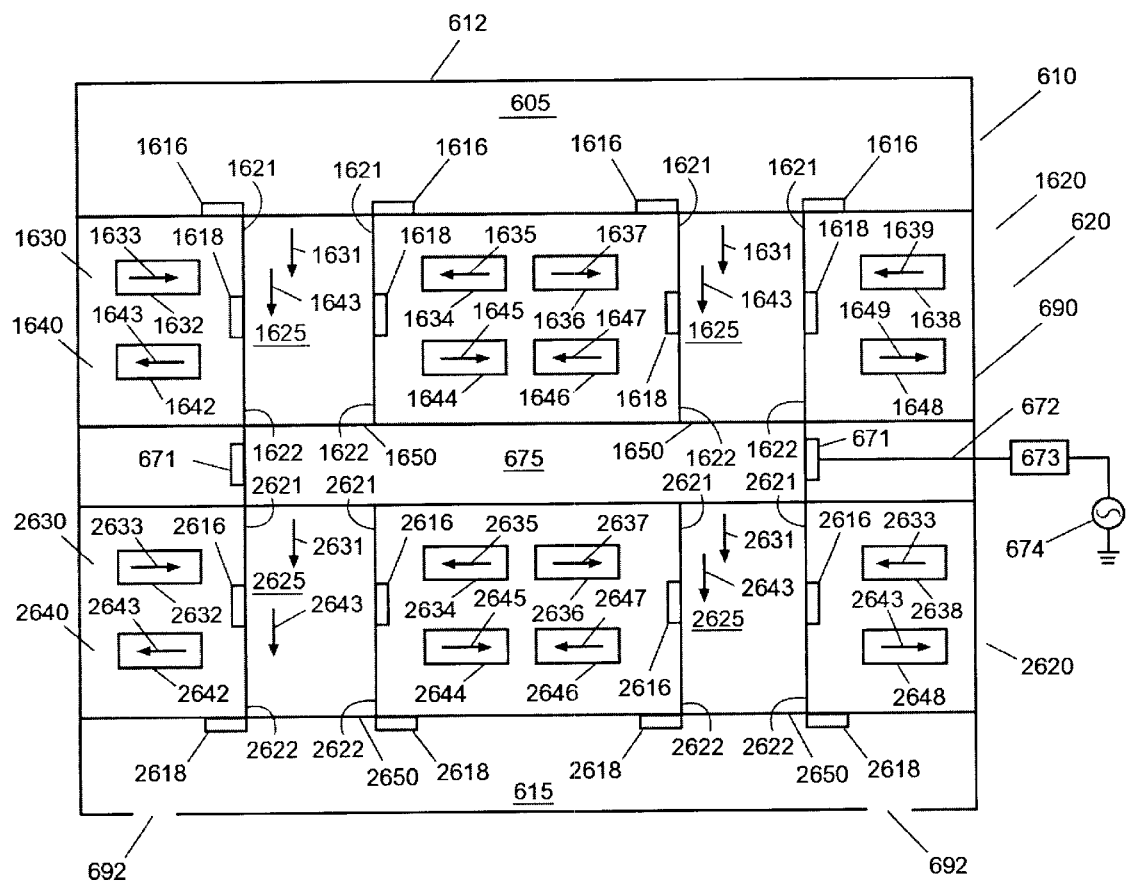
FIG. 6 is a schematic view showing a fifth plasma processing system embodying the principles of the present invention.

FIG. 6 is a schematic view showing another plasma processing system embodying the principles of the present invention. Plasma processing system 600 comprises plasma processing device 610 and plasma pump 620.

Plasma pump, generally indicated at 620, is coupled to the plasma-processing device, generally indicated at 610. Plasma processing device 610 includes first region 605 that contains source plasma (not shown).

Plasma processing device 610 comprises chamber 612 that defines the first region of the plasma-processing region, generally indicated at 605. Those skilled in the art will recognize that chamber 612 can contain a mounting device, which can be configured to attach a substrate thereon in order to deposit a layer of material on, or etch material from, the substrate surface.

A plasma generation gas or any other gas which is ionizable to produce a plasma, for example, argon gas, nitrogen gas, xenon gas, or the like, is introduced into plasma processing device 610, for example by a gas supply system (not shown), to be made into plasma. The gas supply system and gas are selected according to the desired application as understood by one skilled in the art. Plasma processing device 610 can comprise an inductively coupled plasma (ICP) source or a capacitively coupled plasma (CCP) source to produce plasma within first region 605. The plasma in first region 605 can also be referred to as source plasma.

Plasma pump 620 comprises housing 690 that includes second region 615 that can contain second plasma (not shown). The plasma in second region 615 can also be referred to as exit plasma. Second region 615 can be at a higher pressure than first region 605 and may contain a mixture of charged and neutral particles. Plasma pump 620 is configured to pump charged and neutral particles from first region 605 to second region 615 so that the pumped particles pass through outlet 650.

Plasma pump 620 further comprises first APDS cell 1620, inter-stage plasma (ISP) source 670, and second APDS cell 2620.

First APDS cell 1620 includes magnetic field generator 1630 and magnetic field generator 1640 that are constructed and arranged to generate a magnetic field within conduit 1625.

As shown in FIG. 6, magnet array 1630 and magnet array 1640 generate a magnetic field, indicated by exemplary lines of force illustrated by single-headed arrows 1631 within conduit 1625. Magnet array 1630 comprises magnetic elements 1632 and 1638 that are disposed circumferentially around the outer periphery of conduit 1625 at inlet end 1621 thereof. Magnet array 1630 further comprises magnetic elements 1634 and 1636 that are disposed circumferentially around the inner periphery of conduit 1625 at inlet end 1621 thereof. Single-headed arrows 1633, 1635, 1637, and 1639 illustrated within magnetic elements 1632, 1634, 1636, and 1638, respectively, indicate the polarization direction of magnetic elements 1632, 1634, 1636, and 1638 that comprise magnet array 1630 used to form the desired field 1631.

Magnet array 1640 comprises magnetic elements 1642 and 1648 that are disposed circumferentially around the outer periphery of conduit 1625 at inlet end 1621 thereof. Magnet array 1640 further comprises magnetic elements 1644 and 1646 that are disposed circumferentially around the inner periphery of conduit 1625 at outlet end 1622 thereof. Single-headed arrows 1643, 1645, 1647, and 1649 illustrated within magnetic elements 1642, 1644, 1646, and 1648, respectively, indicate the polarization direction of magnetic elements 1642, 1644, 1646, and 1648 that comprise magnet array 1640 used to form the desired field 1631.

Second APDS cell 2620 includes magnetic field generator 2630 and magnetic field generator 2640 that are constructed and arranged to generate a magnetic field B within conduit 2625.

As shown in FIG. 6, magnet array 2630 and magnet array 2640 generate a magnetic field, indicated by exemplary lines of force illustrated by single-headed arrows 2631 within conduit 2625. Magnet array 2630 comprises magnetic elements 2632 and 2638 that are disposed circumferentially around the outer periphery of conduit 2625 at inlet end 2621 thereof. Magnet array 2630 further comprises magnetic elements 2634 and 2636 that are disposed circumferentially around the inner periphery of conduit 2625 at inlet end 2621 thereof. Single-headed arrows 2633, 2635, 2637, and 2639 illustrated within magnetic elements 2632, 2634, 2636, and 2638, respectively, indicate the polarization direction of magnetic elements 2632, 2634, 2636, and 2638 that comprise magnet array 2630 used to form the desired field 2631.

Magnet array 2640 comprises magnetic elements 2642 and 2648 that are disposed circumferentially around the outer periphery of conduit 2625 at inlet end 2621 thereof. Magnet array 2640 further comprises magnetic elements 2644 and 2646 that are disposed circumferentially around the inner periphery of conduit 2625 at outlet end 2622 thereof. Single-headed arrows 2643, 2645, 2647, and 2649 illustrated within magnetic elements 2642, 2644, 2646, and 2648, respectively, indicate the polarization direction of magnetic elements 2642, 2644, 2646, and 2648 that comprise magnet array 2640 used to form the desired field 2631.

In the illustrated embodiment, magnet arrays 1630, 1640, 2630, and 2640 are of mirror image construction. In addition, magnetic elements in magnet arrays 1630, 1640, 2630, and 2640 are permanent magnets arrayed in an annular configuration around the conduits. In an alternate embodiment, magnetic elements in magnet arrays 1630, 1640, 2630, and 2640 can comprise electromagnets.

In the illustrated embodiment, ISP source 670 comprises electrode 671, transmission line 672, and duct 675. Duct 675 further comprises inlet 677, outlet 678, and wall 679. Electrode 671 can comprise one or more circumferentially extending electrodes to which RF power can be applied.

In FIG. 6, a single RF electrode 671 is shown extending circumferentially around duct 675. RF generator 674, matching network 673, and transmission line 672 are also shown in FIG. 6. RF power at suitable frequencies and power levels can be applied to antenna 671 through matching network 673, and transmission line 672. The purpose of ISP source 670 can be to offset the loss of plasma and heat to the walls of the conduit by leakage through the ring cusps. Through suitable adjustment of the RF power to the electrode 671 the plasma density and temperature can be maintained uniform throughout the length of duct 675.

Chamber outlet 692, which is illustrated as a ring in FIG. 6, is formed in chamber 612 to enable particles within the plasma processing region 605 to exit chamber 612 and enter conduit 1625 in plasma pump 620.

Conduit 1625 comprises inlet end 1621 disposed in fluid communication with chamber outlet 692 and distal end 1622. Conduit 1625 further comprises outlet 1650 that is located at distal end 1622. Outer wall 1626 of the conduit 1625 extends between the inlet and distal ends 1621, 1622 thereof.

In the illustrated embodiment, inlet 677 of ISP source 670 is coupled to outlet 1650 of first APDS cell 618. Outlet 678 of ISP source 670 is coupled to inlet end 2621 of second APDS cell 2620. Conduit 1625, duct 675, and conduit 2625 are coupled together to form a pump channel for pump 620.

Electrode 1616 can be positioned adjacent inlet end 1621 of conduit 1625, as shown in FIG. 6. In the illustrated embodiment, electrode 1616 can be biased by an adjustable power supply (not shown) to a constant voltage, such as, for example, 0 volts, +10 volts (V) or another appropriate bias voltage. In an alternate embodiment, electrode 1616 can be biased by an adjustable power supply (not shown) to a time varying voltage.

Electrode 1618 can be positioned away from inlet end 1621 of conduit 1625, as shown in FIG. 6. In the illustrated embodiment, electrode 1618 can also be biased by an adjustable power supply (not shown) to a constant voltage, such as, for example, 0 volts, −10 volts (V) or another appropriate bias voltage. In an alternate embodiment, electrode 1616 can be biased by an adjustable power supply (not shown) to a time varying voltage.

In the illustrated embodiment, electrode 1616 is electrically positive relative to electrode 1618, which generates a DC electric field 1643 in the direction toward the distal end of conduit 1625. Electrodes 1616 and 1618 are used to provide a directed electric field having suitable strength therebetween and a directional component parallel to axis 1624. In the illustrated embodiment, ions transfer energy to the neutral particles as well as being accelerated through conduit 1625 by electric field 1643. In alternate embodiments, magnetic field 1631 and electric field 1643 can have time-varying components.

In the illustrated embodiment, conduit 1625 can be formed, for example of aluminum, in a generally annular shape to have outer wall 1626 and inner wall 1627, for example, made from a metal oxide such as alumina or silica (quartz) or another insulator or dielectric material. Outer wall 1626, and inner wall 1627 extend generally parallel to the longitudinally extending axis 1624.

Electrode 2618 can be positioned adjacent outlet end 2622 of conduit 2625, as shown in FIG. 6. In the illustrated embodiment, electrode 2618 can be biased by an adjustable power supply (not shown) to a constant voltage, such as, for example, 0 volts, −10 volts (V) or another appropriate bias voltage. In an alternate embodiment, electrode 2618 can be biased by an adjustable power supply (not shown) to a time varying voltage.

Electrode 2616 can be positioned away from inlet end 2621 of conduit 2625, as shown in FIG. 6. In the illustrated embodiment, electrode 2616 can be also biased by an adjustable power supply (not shown) to a constant voltage, such as, for example, 0 volts, +10 volts (V) or another appropriate bias voltage. In an alternate embodiment, electrodes can be biased by an adjustable power supply (not shown) to a time varying voltage.

In the illustrated embodiment, electrode 2616 is electrically positive relative to electrode 2618, which generates a DC electric field 2643 in the direction toward the distal end of conduit 2625. Electrodes 2616 and 2618 are used to provide a directed electric field having suitable strength therebetween and transverse to the magnetic field 2631). In the illustrated embodiment, ions transfer energy to the neutral particles as well as being accelerated through conduit 2625 by magnetic field 2631 and electric field 2643. In alternate embodiments, magnetic field 2631 and electric field 2643 can have time-varying components.

In the illustrated embodiment, conduit 2625 can be formed, for example of aluminum, in a generally annular shape to have outer wall 2626 and inner wall 2527, for example, made from a metal oxide such as alumina or silica (quartz) or another insulator or dielectric material. Outer wall 2626, and inner wall 2627 extend generally parallel to the longitudinally extending axis 2624.

Figure 7:
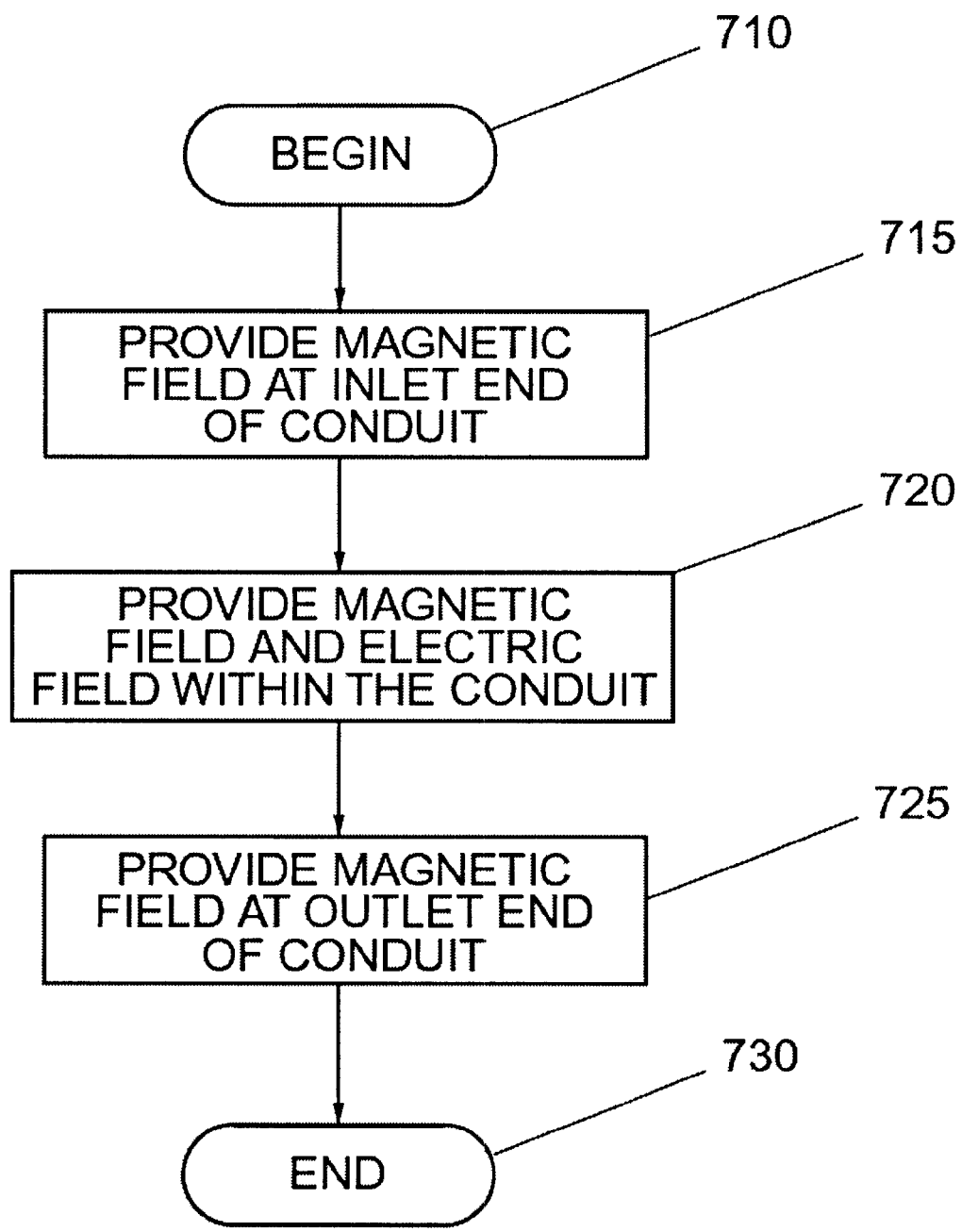
FIG. 7 shows a method of operating an APDS cell embodying the principles of the present invention.

FIG. 7 shows a method of operating an APDS cell embodying the principles of the present invention. Method 700 illustrates a procedure for pumping particles from a first region containing source plasma to the second region containing exit plasma through a conduit, and method 700 begins at step 710.

In step 715, particles are moved into the inlet end of a conduit. In one embodiment, a magnetic field is provided having field lines generally parallel to a longitudinal axis of the conduit.

In step 720, particles are moved from the inlet end towards the outlet located at the distal end of the conduit. In one embodiment, a magnetic field and a DC electric field are provided having field lines generally parallel to a longitudinal axis of the conduit. In alternate embodiments, a magnetic field or a DC electric field can be provided having field lines generally parallel to a longitudinal axis of the conduit. In addition, a time-varying magnetic field and/or a time-varying DC electric field can be provided having field lines generally parallel to a longitudinal axis of the conduit.

In step 725, particles are removed from the outlet at the distal end of the conduit. In one embodiment, a high voltage, radio frequency electric field can be provided within the conduit radially inward of a conduit outlet. The electric field can be configured to accelerate charged particles within the conduit radially through ion cyclotron resonance so as to pass through the conduit outlet. Those resonant charged particles absorb energy from the electric field while non-resonant charged particles are not affected by the electric field. In step 730, method 700 ends.

The present invention provides a robust, cost-effective technology capable of high-speed pumping in the pressure range from 1–50 milliTorr.

Furthermore, the effluent gases from the process plasma usually include perfluorocompounds (PFCs), such as $CF_4$, $CHF_3$, $C_2F_6$, $C_3F_8$, $C_4F_8$, $C_5F_8$, $SF_6$, and $NF_3$, which are considered as greenhouse gases. In 1996 the American semiconductor industry signed a memorandum of understanding with the United States Environmental Protection Agency in which manufacturers committed to reducing emission of the greenhouse gases. Recent experimental and simulation studies have shown that plasma abatement of PFCs with a variety of plasma sources can effectively reduce PFC emission. In this regard, the APDS and its plasma-pumping conduit is an ideal plasma abatement system for the environmental control of PFC gases.

The properties of this magnetic configuration permit the plasma electrons to follow the plasma ions in the electric field and thereby maintain the overall electrical neutrality of the plasma. This unusual form of ambipolar transport is mediated by internal electric fields. These may arise in localized regions containing a net electrostatic space charge due, for example, to magnetically trapped plasma electrons. Such regions give rise to electric fields within the plasma that help guide the (unmagnetized) plasma ions into the pumping ducts. These electric fields also cause electron currents to flow in the plasma; the Lorentz force on such currents then causes the electrons to flow in the direction of ion flow. Additional electric fields can be applied by external means such as DC or RF bias to augment the acceleration of ions through the duct and further reduce the rate at which electrons and heat are lost to the inner wall of the duct.

The plasma vacuum pump of the present invention is comprised of an assembly of permanent magnets, suitably shaped plasma conduits or ducts, and electrodes for accelerating plasma ions as they pass through the conduits. Each individual plasma pumping cell is referred to as an APDS cell. Some of the magnetic lines of force generated by the permanent magnets pass through the plasma conduits in such a way that plasma ions and electrons flowing out of the volume to be pumped are magnetically guided through the plasma conduit into the high-pressure region. Additionally, some of the plasma electrons diffuse across the magnetic field above the APDS cell into regions in which the local magnetic field strength is high enough to significantly reduce the rate at which these electrons can be further transported across the magnetic field. The local concentration of plasma electrons can be slightly higher in these regions than the local concentration of plasma ions.

In the APDS magnetic configuration, the resulting space-charge potentials and associated electric fields can lead to a plasma transport mechanism that prevents ions from striking the wall above the APDS cell and permits electrons to flow across the magnetic field so as to follow the flow of the plasma ions. This mechanism, which we shall refer to as Lorentzian ambipolar flow, is described in greater detail below. Various forms of electrostatic biases may be applied to the plasma column inside the plasma conduit to transfer additional momentum to the plasma ions and thereby increase their flow velocity above the ion sound speed.

The magnetic field in each cell can be generated by bars of permanent magnetic material arranged circumferentially around the central plasma conduit and transverse to the axis of the conduit to form, for example, hollow, cylindrical arrays or rings, magnetized transverse to the axis of the plasma conduit, as shown in FIG. 1A and FIG. 1B (for the magnetic field). A plurality of such arrays with alternating polarities, spaced at regular intervals along the axis of the plasma conduit, forms a multi-cusp magnetic geometry in which the ring cusps enclose the circumference of the plasma conduit with the direction of the magnetic field perpendicular to the radial wall of the conduit. The magnetic field can be made very small outside the cell and near the axis of the cell but large enough near the inner walls of the plasma conduit to provide the desired magnetic trapping of the plasma electrons.

There is an internal electric field along the duct axis naturally developed in the plasma there. Because the plasma from the process system expanses into the duct, the plasma density n(z) gradually decreases from the entrance density $n_o$. There is a plasma potential distribution $\phi(z)$ associated with the density profile determined by the Boltzmann relation:

$$n(z)=n_o e^{-e\phi(z)/kT} \quad (1)$$

where e is the electronic charge, T is the electron temperature in unit of K, and k is the Boltzmann constant, k=1.3807×10−23 J/K. Thus, there is an electric field E=−d$\phi$/dz=kT/e d[ln(n(z)]/dz. Along the axis of the duct, the electric field tends to accelerate the positively charged ions to the duct until the duct is filled up by the plasma with density $n_o$.

By forming the cells from a suitable array of permanent magnets, arbitrarily large arrays of pumping cells can be constructed, as shown schematically in FIG. 3. The area within which plasma is gathered into the plasma conduit or duct depends on the detailed features of the combination of magnetic and electric fields in the region just above the surface of the conduit and can be larger than the cross-sectional area of the aperture of the plasma conduit.

Resonant charge-exchange interactions between the plasma ions and the process gas particles result in significant transfer of momentum to gas particles, thereby augmenting the flow of particles through the conduit.

An advantage of using the process plasma for plasma pumping is that some momentum is imparted to the ions in the same chamber where the plasma is being used. The gas atoms do not have to be transported through some transitional structure (part of the chamber) in order to be removed from the system. Each collision provides an opportunity for the particles to attach to the walls and perhaps eventually be returned to the substrate as an altered molecular species. If the particles are removed from the chamber quickly and with as little modification as possible, then the control of the process is facilitated.

Since the plasma ions and electrons are electrically charged, their motions are affected by the magnetic field through the Lorentz Force:

$$F=q(E+v \times B).$$

Here F is the force on a particle of electrical charge q, moving with velocity v through electric, E, and magnetic, B, fields. The magnetic force is perpendicular both to the velocity, v, and the magnetic field, B, and can transform the full three-dimensional motion of an electrically neutral particle, such as a gas particle (molecule), into an effectively one-dimensional motion of an electrically charged particle along the magnetic lines of force. The electrically charged particles move in spiral paths centered on the magnetic field lines and with radii equal to the gyroradius, $\rho$:

$$\rho=M\, v_\perp/q\, B.$$

Here M is the charged-particle mass, and $v_\perp$ is the component of particle velocity perpendicular to B. The magnetic fields of the present invention are generally weak enough that the ion gyroradius is larger than the dimensions of the APDS cell, while the electron gyroradius is much smaller than the dimensions of the cell, especially near the inner surface of the conduit where the local magnetic intensity is very high. Ion motions are therefore not directly affected by the magnetic field, but rather are indirectly affected through the space-charge electric fields due to the magnetized electrons.

A second principle underlying the plasma vacuum pump is that plasma ions will generally flow from the body of the plasma to its surface at the ion acoustic speed, $c_s$:

$$c_s=(2\, kT_e/M_i)^{1/2}$$

Here $kT_e$ is average kinetic energy of the plasma electrons and the ionic mass is $M_i$. Because the electrons are typically hotter than the neutral particle by roughly 100 times, the sound speed can be 10 times greater than the thermal speed of the neutral gas molecules. For this reason, plasma ions can flow along magnetic fields through the conduits at much higher rates than the neutral gas molecules.

The two principles described here suggest that the flow speed of ions through conduits can be greater than the neutral gas flow speed through the conduits. There is an additional passive mechanism that may contribute to the plasma pumping process; namely, the compression of the plasma flow caused by the reduction of the cross sectional area of the flux tube formed by magnetic lines of force. Specifically, as the plasma flows toward the outlet end the magnetic field strength increases and the magnetic lines of force converge to a higher density. Plasma bound to these converging lines of force must also be compressed by an equal amount. Since the density of field lines is equal to the magnitude of the magnetic intensity, the compression ratio is just the ratio of the maximum magnetic field strength in the interior of the conduit to the field strength at which the plasma electrons can be considered to be bound to the lines of force; i.e., the electron gyroradius is smaller than the length characterizing the spatial gradients in the magnetic field, $L_B$:

$$\rho < L_B = (dB/dz)^{-1}$$

The electron gyroradius, typically much smaller than the ion gyroradius, should be used in this criterion. Critical values of the magnetic field strength are 50–100 Gauss for typical APDS cell dimensions. The consequences of these basic plasma pumping principles are discussed below.

The flow of ions at the ion sound speed depends on the existence of a positive "ambipolar" potential that arises spontaneously to ensure that the body of the plasma is electrically neutral. This neutrality is maintained only if, on average, the plasma electrons are lost from the body of the plasma at the same rate as are the plasma ions. Since in the absence of any magnetic fields the much more mobile electrons would otherwise leave the plasma at a far larger rate than the ions, a positive electrostatic potential arises spontaneously that confines the electrons and reduces their loss rate from the plasma to a value equal to that of the ions. This positive potential is nearly constant throughout the body of the plasma, but decreases in a region (the "sheath") localized near the surface of the plasma. Ions arriving at this surface sheath are accelerated to the ion sound speed by the associated electrostatic field.

If the magnetic fields in the sheath region are large enough to restrict the motion of electrons, but not strong enough to similarly affect the ions, local electrostatic fields can be formed as indicated earlier. Additionally, at high neutral-gas pressures, the accelerated ions may undergo charge exchange reactions in which they are neutralized by capturing an electron from an ambient gas molecule. In such a process, the escaping energetic ion is replaced by an ion whose energy is just that of the thermal gas molecules, and the local density of ions can rise in inverse proportion to the change in speeds of the ions. (The neutralized fast ion is no longer magnetized and resumes its full three-dimensional motion, albeit with the velocity of the ion from which it was neutralized.) A local positive space charge can then arise and result in a positive electrostatic field that would retard the outward flow of the ions. To prevent the development of any such positive space-charge fields, the present invention provides means by which plasma electrons can flow across the magnetic field to neutralize the out flowing plasma ions. It would be impractical to provide enough electron current to neutralize the entire stream of ions unless the electrons could be retained in the plasma conduits for times that are equal to the transit time of ions through the conduits. The geometric properties of the magnetic field generated by the permanent magnet arrays provide the necessary mechanism for trapping the injected electrons magnetically, thereby permitting the necessary neutralization without losing an excessive number of the more mobile electrons to the walls of the conduit.

The flow of ions and electrons through the conduit can be described by the steady-state momentum transfer equations for each species separately:

$$Mn(v_i \cdot \nabla)v_i = en(E + v_i \times B) - \nabla P_i$$

$$mn(v_e \cdot \nabla)v_e = -en(E + v_e \times B) - \nabla P_e$$

Here M and m are the ion and electron masses, respectively; and $v_i$ and $v_e$ are their flow velocities. Their densities, n, are equal by virtue of the quasi-neutrality of plasmas of the density and dimensions of interest here. E and B are the electric and magnetic fields present in the plasma; and $P_i$ and $P_e$ are the ion and electron pressures. Adding the two equations yields the following single equation:

$$Mn(v_i \cdot \nabla)v_i + mn(v_e \cdot \nabla)v_e = en(v_i \times B - v_e \times B) - \nabla P$$

Because m<<M we can generally neglect the electron momentum term and write $$Mn(v_i \cdot \nabla)v_i = en(v_i \times B - v_e \times B) - \nabla P$$

Taking the scalar product with $v_i$ yields $$Mn\, v_i \cdot (v_i \cdot \nabla)v_i = -en\, v_i \cdot (v_e \times B) - v_i \cdot \nabla P$$

We can identify $j_e \times B = -env_e \times B$ as the Lorentz force acting on the (azimuthal) electron current, $j_e = -env_e$. In the axisymmetric magnetic configuration of the APDS cell such a current can arise from (azimuthal) electron drift motions associated with any local electric fields:

$$v_e = (E \times B)/B^2$$

The Lorentz force on the electron current then takes the following form:

$$j_e \times B = -env_e \times B = -en(E \times B) \times B/B^2 = enE - enE_\parallel B/B$$

This term may be negligible in the ion momentum transfer equation, where the momentum transfer is dominated by the pressure gradient forces; but it is conceptually important in providing a means by which electrons can flow across the magnetic field and thereby follow the ion flow. If such a process is not possible, positive space charge will rapidly build up and stop the flow of ions. Note that in the absence of electric fields parallel to the magnetic fields, the Lorentz force is in the direction of the electric field; that is, parallel to the electrostatic force on the plasma ions.

It should be emphasized that the APDS configuration makes it possible for electron currents to flow in response to the space-charge electric fields in the plasma so that the build up of positive space charge is prevented. The dominant ion dynamics are given by the remaining terms; namely:

$$v_i(v_i \cdot \nabla)v_i = -v_i \cdot \nabla P/Mn.$$

Treating the pressure as a function of the plasma density permits us to write this as:

$$v_i(v_i \cdot \nabla)v_i = -v_i \cdot \nabla n (dP/dn)/Mn = -c_s^2\, (v_i \cdot \nabla n)/n$$

where $c_s^2$ is the square of the ion acoustic speed.

If we now invoke the continuity equation for the ion flow we can obtain an important insight into the manner in which ions are accelerated as they flow through the conduit of the APDS cell. In the axisymmetric geometry of the APDS cell tubes of flow will have cylindrical geometry. Let A be the cross sectional area of such a tube. Because the ion flow must satisfy the continuity equation, we have:

$$[(v_i \cdot \nabla) n v_i A]/n v_i A = 0$$

or, $$[(v_i \cdot \nabla)n]/n + [(v_i \cdot \nabla)v_i]/v_i + [(v_i \cdot \nabla)A]/A = 0.$$

Since from the momentum transfer equation:

$$v_i(v_i \cdot \nabla v_i) = -c_s^2(v_i \cdot \nabla n)/n,$$

we have $$(v_i \cdot \nabla n) = -n\, v_i(v_i \cdot \nabla v_i)/c_s^2,$$

whence the continuity equation becomes $$-(v_i/c_s)^2(v_i \cdot \nabla v_i) + (v_i \cdot \nabla v_i) + v_i[(v_i \cdot \nabla)A]/A = 0$$

or, $$[1-(v_i/c_s)^2](v_i \cdot \nabla v_i)/v_i + [(v_i \cdot \nabla)A]/A = 0$$

Note from the momentum transfer equation that since $(v_i \cdot \nabla n) < 0$ (i.e., the density gradient and the ion flow are in opposite directions), then $(v_i \cdot \nabla v_i) > 0$. We can immediately conclude that for subsonic flow $(v_i \cdot \nabla)A < 0$, whereas for supersonic flow $(v_i \cdot \nabla)A > 0$. Thus, in a region of converging subsonic flow. the ion flow must be accelerated and become supersonic in a region of diverging flow. Ions entering the converging magnetic funnel of the APDS conduit at the ion sound speed are accelerated (by the pressure gradient forces) and become supersonic in the diverging magnetic fields of the outlet of the conduit.

While the invention has been described with reference to certain illustrated embodiments, including particular structures, acts and materials, the invention is not to be limited to the particulars disclosed, but rather extends to all equivalent structures, acts, and materials, such are within the scope of the appended claims.

Since numerous modifications and changes to the embodiments described above will readily occur to those of ordinary skill in the art, it is not desired to limit the invention to the exact construction and operation illustrated and described. Accordingly, all suitable modifications and equivalents should be considered as falling within the spirit and scope of the invention.

What is claimed is:

1. A plasma processing system comprising:
    plasma processing chamber; and
    plasma pump to pump particles from a first region in the plasma processing chamber containing a plasma to a second region containing a plasma at a higher pressure, wherein the plasma pump comprises a plurality of applied plasma duct system (APDS) cells, wherein each APDS cell comprises:
        conduit having an inlet end, an outlet end, and at least one wall extending from the inlet end to the outlet end, the conduit fluidly coupled to the first region and the second region;
        magnetic field generator, constructed and arranged to generate a magnetic field having field lines generally parallel to the conduit's longitudinal axis; and
        electric field generator, constructed and arranged to generate an electric field having field lines generally parallel to the conduit's longitudinal axis, such that charged particles within the conduit are accelerated longitudinally so as to pass through the conduit outlet.

2. The plasma processing system of claim 1, wherein said magnetic field generator comprises a plurality of magnet arrays with alternating polarities, spaced at intervals along the conduit, said magnetic field generator forming a multi-cusp magnetic geometry in which the ring cusps enclose the circumference of the conduit and the direction of the magnetic field is perpendicular to the conduit's longitudinal axis.

3. The plasma processing system of claim 1, wherein said magnetic field generator comprises a plurality of magnet arrays with alternating polarities, spaced at intervals along the axis of the conduit, said magnetic field generator permitting plasma electrons to move with plasma ions in the electric field, thereby maintaining the overall electrical neutrality of the plasma within the conduit.

4. The plasma processing system of claim 1, wherein the plurality of APDS cells is arranged in a parallel arrangement.

5. The plasma processing system of claim 1, wherein the plurality of APDS cells is arranged in a serial arrangement.

6. The plasma processing system of claim 1, wherein the plurality of APDS cells is arranged in a serial/parallel arrangement.

7. The plasma processing system of claim 1, wherein the plasma pump further comprises an Inter-Stage Plasma (ISP) generator.

8. The plasma processing system of claim 7, wherein the plasma pump further comprises at least one additional APDS cell coupled to the ISP generator.

9. The plasma processing system of claim 1, wherein the APDS cell further comprises at least one baffle configured and positioned to allow ions to pass therethrough in one direction and to prevent ions having a lower energy from passing through in an opposite direction.

10. A plasma pump to pump particles from a first region containing a plasma to a second region containing a plasma at a higher pressure, comprising:
    housing comprising inlet port to enable particles within the first region to enter the pump, outlet port to enable particles within the second region to exit the pump, and including the second region therein; and
    applied plasma duct system (APDS) cell coupled to the housing between the first and second region, wherein the APDS cell comprises:
        conduit having an inlet end, an outlet end, and at least one wall extending from the inlet end to the outlet end;
        magnetic field generator, constructed and arranged to generate a magnetic field having field lines generally parallel to the conduit's longitudinal axis; and
        electric field generator, constructed and arranged to generate an electric field having field lines generally parallel to the conduit's longitudinal axis, such that charged particles within the conduit are accelerated longitudinally so as to pass through the conduit outlet.

11. The plasma pump of claim 10, wherein the plasma pump further comprises at least one other APDS cell coupled in series with the APDS cell.

12. The plasma pump of claim 10, wherein the plasma pump further comprises at least one other APDS cell coupled in parallel with the APDS cell.

13. The plasma pump of claim 10, wherein the plasma pump further comprises an Inter-Stage Plasma (ISP) generator coupled in series with the APDS cell.

14. The plasma pump of claim 13, wherein the plasma pump further comprises at least one additional APDS cell coupled to the ISP generator.

15. The plasma pump of claim 10, wherein the APDS cell further comprises at least one baffle configured and positioned to allow ions to pass therethrough in one direction and to prevent ions having a lower energy from passing through in an opposite direction.

16. An APDS cell to pump particles from a first region containing a plasma to a second region containing a plasma at a higher pressure, comprising:
    conduit having an inlet end, an outlet end, and at least one wall extending from the inlet end to the outlet end;
    magnetic field generator, constructed and arranged to generate a magnetic field having field lines generally parallel to the conduit's longitudinal axis; and
    electric field generator, constructed and arranged to generate an electric field having field lines generally parallel to the conduit's longitudinal axis, such that charged particles within the conduit are accelerated longitudinally so as to pass through the conduit.

17. The APDS cell of claim 16, wherein the conduit is cylindrical.

18. The APDS cell of claim 16, wherein the conduit is annular.

19. The APDS cell of claim 16, wherein the conduit is rectangular.

20. The APDS cell of claim 16, wherein the electric generator includes at least one electrode having a DC-bias.

21. The APDS cell of claim 16, wherein the electric generator includes at least one electrode coupled to an RF generator.

22. The APDS cell of claim 16, wherein the magnetic field generator includes a first magnet array and a second magnet array configured and positioned to have polarization directions substantially parallel to one another.

23. The APDS cell of claim 16, the APDS cell further comprising at least one other magnetic field generator, constructed and arranged to generate at least one other magnetic field having field lines generally parallel to the conduit's longitudinal axis.

24. The APDS cell of claim 16, the APDS cell further comprising at least one other electric field generator, constructed and arranged to generate at least one other electric field having field lines generally parallel to the conduit's longitudinal axis.

25. The APDS cell of claim 16, the APDS cell further comprising at least one baffle configured and positioned to allow ions to pass therethrough in one direction and to prevent ions having a lower energy from passing through in an opposite direction.

26. The APDS cell of claim 16, wherein the APDS cell further comprises an Inter-Stage Plasma (ISP) generator coupled in series with the APDS cell.

27. The APDS cell of claim 26, wherein the ISP generator comprises a capacitively coupled plasma (CCP) source.

28. The APDS cell of claim 26, wherein the ISP generator comprises an inductively coupled plasma (ICP) source.

29. The APDS cell of claim 26, wherein the ISP generator comprises a microwave source.

30. A method of pumping particles from a first region containing a plasma to a second region through a conduit having an inlet end disposed in fluid communication with the chamber outlet, a radially directed outlet, and a longitudinal axis extending from the inlet end towards a distal end, comprising:

providing a magnetic field, in the conduit, having field lines generally parallel to the longitudinal axis; and providing an electric field, in the conduit, having field lines generally parallel to the longitudinal axis such that charged particles within the conduit are accelerated longitudinally so as to pass through the conduit.

* * * * *